(12) United States Patent
Theodore

(10) Patent No.: US 10,374,127 B2
(45) Date of Patent: Aug. 6, 2019

(54) ELECTRONIC DEVICES WITH NANORINGS, AND METHODS OF MANUFACTURE THEREOF

(71) Applicant: Freescale Semiconductor, Inc., Austin, TX (US)

(72) Inventor: Nirmal David Theodore, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/856,971

(22) Filed: Sep. 17, 2015

(65) Prior Publication Data

US 2017/0084786 A1   Mar. 23, 2017

(51) Int. Cl.
| | | |
|---|---|---|
| H01L 31/18 | (2006.01) | |
| H01L 33/00 | (2010.01) | |
| H01L 33/32 | (2010.01) | |
| H01L 33/20 | (2010.01) | |
| H01L 31/0304 | (2006.01) | |
| H01L 31/0352 | (2006.01) | |

(52) U.S. Cl.
CPC ........ *H01L 33/32* (2013.01); *H01L 31/03044* (2013.01); *H01L 31/035281* (2013.01); *H01L 31/1848* (2013.01); *H01L 33/0075* (2013.01); *H01L 33/20* (2013.01)

(58) Field of Classification Search
CPC ..... H01L 2924/12041; H01L 27/14625; H01L 27/14627; H01L 27/14621; G02B 27/4205; G02B 5/1814; G02B 3/0062; G02B 1/11
See application file for complete search history.

(56) References Cited

U.S. PATENT DOCUMENTS

| | | | | |
|---|---|---|---|---|
| 7,947,989 B2* | 5/2011 | Ha | ...................... | H01L 33/0079 257/79 |
| 8,008,672 B2* | 8/2011 | Moon | ..................... | H01L 33/08 257/13 |
| 8,735,867 B2* | 5/2014 | Seong | .................. | H01L 27/156 257/13 |
| 9,159,882 B2* | 10/2015 | Hwang | .................. | H01L 33/46 |
| 2005/0194598 A1* | 9/2005 | Kim | ........................ | H01L 33/08 257/79 |
| 2008/0006319 A1* | 1/2008 | Bettge | .................... | B82Y 20/00 136/244 |
| 2008/0157057 A1* | 7/2008 | Kim | ........................ | H01L 33/06 257/13 |
| 2011/0156088 A1* | 6/2011 | Moon | ..................... | H01L 33/08 257/99 |

(Continued)

OTHER PUBLICATIONS

Chang et al, "Electrically driven green, olivine, and amber color nanopyramid light emitting diodes," Optics Express, (2013), vol. 21, No. 20, pp. 23030-23035.*

(Continued)

*Primary Examiner* — Julia Slutsker

(57) ABSTRACT

Systems and methods for electronic devices are presented. A device includes a substrate. An Indium Gallium Nitride (InGaN) nanoring is formed over the substrate. The InGaN nanoring includes an alloy of Indium Nitride (InN) and Gallium Nitride (GaN). The alloy includes at least 6 percent Indium. A GaN layer may be formed over the InGaN nanoring, and a first electrode is formed over the GaN layer. In one embodiment, the alloy includes less than about 70 percent Indium.

17 Claims, 7 Drawing Sheets

(56) References Cited

U.S. PATENT DOCUMENTS

2011/0233581 A1* 9/2011 Sills .................. H01L 33/06
258/98

OTHER PUBLICATIONS

Choi et al, ("InGaN nano-ring structures for high-efficiency light emitting diodes," Applied Physics Letters 86, 021101 (2005).*
Jeon et al, "Fabrication of Two-Dimensional InGaN-Based Micro-LED Arrays," Phys. stat. sol. (a) 192, No. 2, 325-328 (2002).*
Zaidi, "Growth of InGaN Nanorings via Metal Organic Chemical Vapor Deposition," Master Thesis, Arizona State University, 2012.*
Chen et al., "InGaN nanorings and nanodots by selective area epitaxy," Appl. Phys. Lett. 87, 143111 (2005).*

* cited by examiner

ELECTRONIC DEVICES WITH NANORINGS, AND METHODS OF MANUFACTURE THEREOF

TECHNICAL FIELD

Embodiments of the subject matter described herein relate generally to electronic devices with nanorings, and methods of their manufacture.

BACKGROUND

Semiconductor devices are ubiquitous in modern electronic products. Semiconductor devices vary in the number and density of electrical components. Discrete semiconductor devices generally contain one type of electrical component, e.g., light emitting diode (LED), transistor, resistor, capacitor, and inductor. Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays.

In the case of devices that either generate or detect light in the visible spectrum, Indium Gallium Nitride (InGaN)-based devices are useful as they can be configured to be sensitive to or generate electromagnetic radiation throughout the visual spectrum. This broad range of operation makes the devices well suited to LED and laser applications.

The particular wavelength of operation of an InGaN device is selected by adjusting the amounts of Indium Nitride (InN) and Gallium Nitride (GaN) contained within the alloy that forms the active part of the device, such as a portion of a diode. When manufacturing these devices, however, the formation of structures that are made from the alloy can be difficult. This is because as more Indium is incorporated into the InGaN alloy, the strain in the InGaN layers increases due to lattice mismatch with the underlying GaN. This can cause defects such as dislocations or cracks in the alloy. In addition, the high strain can cause phase separation so that the InGaN is no longer homogeneous. Such phase separation can make it impossible or difficult to fabricate certain types of devices in a manner in which they operate properly. For example, when conventional methods are used to fabricate green-yellow light emitting or absorbing devices, the InGaN alloy layers may not emit or absorb light in the desired green-yellow optical wavelength range.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1A:
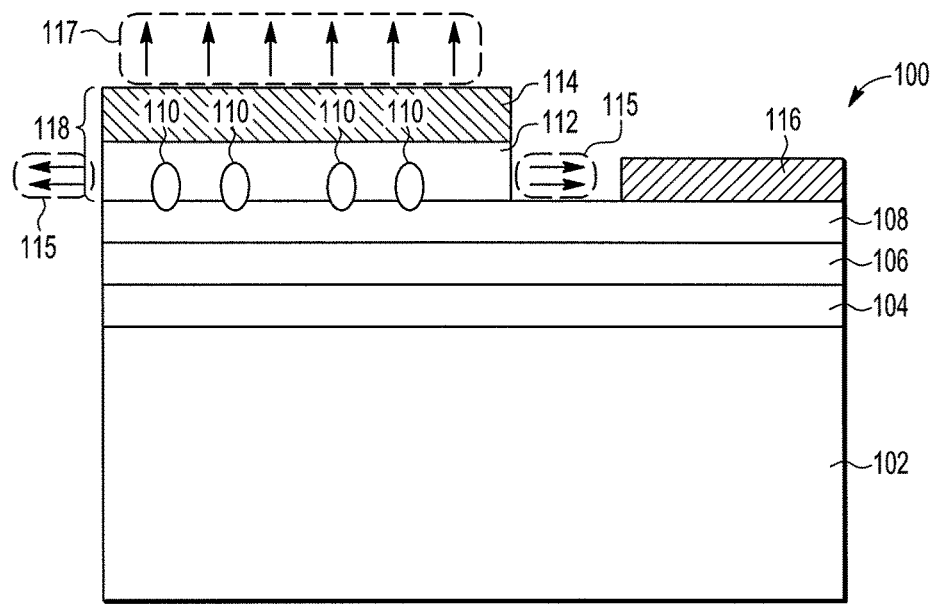
FIG. 1A is a cross-section side view of an embodiment of a device incorporating a number of high-In InGaN nanoring structures.

The present disclosure provides devices and methods for forming high Indium-content non-phase-separated InGaN-based semiconductor devices. In the devices, an InGaN alloy is deposited over a substrate in the form of a ring or nanoring. The ring may be formed by various fabrication techniques, such as droplet-epitaxy. By controlling the concentrations of InN and GaN in the alloy, the operational wavelength of the device (e.g., the wavelengths of electromagnetic radiation (e.g., light) that are either generated or detected by the device) can be selected as desired. A number of different structures may then be formed over and/or interconnected with the InGaN alloy ring structure to construct various devices, as described herein.

In the case of an InGaN alloy, there is lattice mismatch between the InGaN and GaN. Accordingly, as the amount of InN in the alloy increases, high strain can develop when the alloy is deposited on a substrate such as GaN. In various implementations, high strain may result with lattice mismatches (e.g., mismatches exceeding about 2 percent). In the case of InGaN/GaN alloys, strain may be as high as 11 percent in InN/GaN ranging down to 0 percent in epitaxial-GaN/GaN-substrate. This relatively high strain can cause phase separation of the InGaN layers into InN and GaN regions. Such phase separation has been reported for Indium concentrations as low as about 6 percent to about 12 percent and above in InGaN. This inhibits Indium incorporation during InGaN structure formation.

This problem can be exacerbated when using conventional approaches for forming InGaN devices, in which the alloy is deposited over the substrate using window-template growth or lithography. Such an approach physically constrains the alloy structure, resulting in increased defects and strain within the resulting structure. Additionally, lattice mismatch between materials of the alloy and the substrate upon which the alloy is deposited can cause strain and potentially leads to defects and phase separation in the InGaN alloy.

As such, in conventional devices, relatively high-concentrations of InN cannot easily be utilized within the alloy. Conventional devices, therefore, tend to have poor performance in the green-yellow region of the visible spectrum. For example, the green-yellow region may defined as including electromagnetic radiation of wavelengths in ranges of ~520-560 nanometers (nm) for green and ~560-590 nm for yellow. Additionally, in conventional devices, device efficiency can be limited by the piezoelectric field that is inherently present in Wurtzite structures because of the low symmetry of such a structure. The piezoelectric field can cause an undesirable separation of electrons and holes that reduces the efficiency for optical applications.

In contrast, the present device embodiments incorporating InGaN ring structures may exhibit increased flexibility or strain relaxation compared to conventional ring configurations. As a consequence, problems associated with increased strain between the components of the alloy can be reduced. This, in turn, may allow the alloy to contain higher concentrations of InN without leading to phase separation. The increases in allowable concentrations of InN within the alloy may result in improved device performance throughout the visible spectrum and, in particular, within the green-yellow region in which conventional devices can be deficient. Additionally, this approach may increase device efficiency over conventional devices by reducing the piezoelectric and spontaneous polarization fields that can be present within conventional InGaN structures, as a result of the increased strain relaxation.

In the present disclosure a number of example devices and methods for manufacturing the same are described and illustrated. The examples are primarily focused upon the implementation of devices including high Indium-content non-phase-separated InGaN nanorings. But it will be appreciated that the device configurations described herein are each equally applicable to devices incorporating nanoring structures including compounds of two or more other materials where there is a significant lattice mismatch between the various materials making up the compound. For example, compounds made of AlSb/GaAs (Aluminum Antimonide/Gallium Arsenide), GaSb/GaAs (Gallium Antimonide/Gallium Arsenide), InAs/GaAs (Indium Arsenide/Gallium Arsenide), InAs/InP (Indium Arsenide/Indium Phosphide) could be formed as nanorings and incorporated into devices such as the device embodiments of the present disclosure.

Figure 1B:
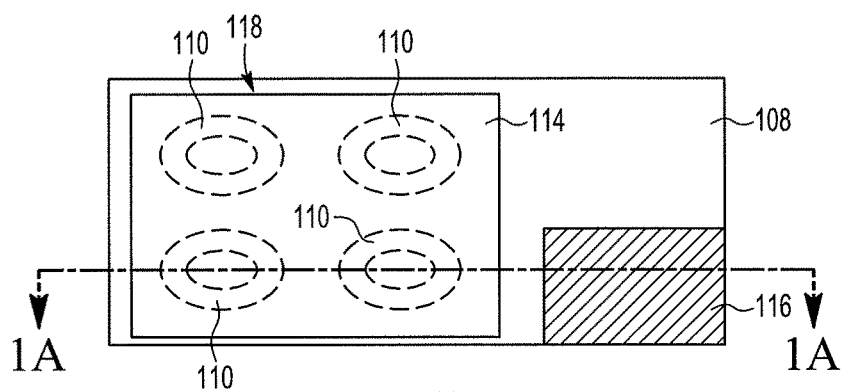
FIG. 1B is a top view of the device of FIG. 1A.

FIG. 1A shows a cross-section side view of device 100 (along line 1A-1A, FIG. 1B) incorporating a number of high-In InGaN nanoring structures. FIG. 1B shows a top view of device 100. Device 100 includes a substrate 102, which has a configuration that depends on the type of system into which device 100 is incorporated. Substrate 102 may include an aluminum-based material such as aluminum oxide (Al2O3). Alternatively, substrate 102 may be selected from any of a variety of materials and their combinations, including semiconductor materials (e.g., Silicon, Gallium Nitride, Gallium Arsenide, and so on), glass, plastic (e.g., polyethylene naphthalate), and so on.

Substrate 102 is nitridized to form a layer 104 of aluminum nitride. A layer 106 of GaN is deposited over the nitridized layer 104 over substrate 102. In an embodiment, layer 106 may have a thickness between about 10 nm to about 1000 nm, although layer 106 may be thinner or thicker, as well. Finally, a layer 108 of n-type GaN is deposited over layer 106. In an embodiment, layer 108 may have a thickness between about 10 nm to about 1000 nm, although layer 108 may be thinner or thicker, as well. Each of layers 104, 106, and 108 may be formed by any suitable fabrication process including Metal-Organic Chemical Vapor Deposition (MOCVD), Molecular Beam Epitaxy (MBE), Atomic Layer Deposition (ALD), or Plasma-Enhanced Chemical Vapor Deposition (PECVD).

Ring structures 110 are then formed over layer 108 (note that in FIG. 1B, ring structures 110 are illustrated using dashed lines as they are formed below some of the material of electrode 114). Ring structures 110 are generally shaped as toroids (i.e., donut-shaped) laying flat on their sides upon layer 108. As such, in the cross section view of FIG. 1A, in which two ring structures 110 are depicted as being cross-sectioned, the cross-section of each ring structure 110 appears as two ovals or circles.

As discussed above, ring structures 110 may be formed out of an InGaN alloy in which the amount of Indium present is selected so that the alloy operates at a desired wavelength of electromagnetic radiation. Generally, the radiation output or sensitivity of ring structures 110 can vary from about 0.7 electron-volts (eV) to about 3.4 eV or from wavelengths of about 1.77 microns (um) to about 0.36 um, although the radiation output and/or wavelengths may be lower or higher, as well. Those of skill in the art would understand, based on the description herein, that the various embodiments may be implemented in devices configured to absorb or produce electromagnetic radiation in any of these ranges, or in other ranges as well.

Ring structures 110 may be formed using any suitable fabrication process. In one embodiment, ring structures 110 are formed by InGaN droplet-epitaxy. In one embodiment, ring structures 110 may be formed as self-assembling InGaN rings based upon an appropriate choice of MOCVD growth conditions. In one example embodiment, ring structures 110 may be formed according to the following process: A sapphire wafer is surface-cleaned with a high-temperature bake at about 1100 Celsius (C) in pure hydrogen gas. Then the surface may be nitrided by flowing nitrogen gas at about 560 C. This results in a thin AlN layer that enables high quality growth of the following layer. A thin GaN nucleation layer can then be grown by flowing ammonia and trimethylgallium source gases with hydrogen as a carrier gas. The resulting GaN layer can then be annealed at about 1130 C for 15 minutes to remove any remaining organic molecules from the precursor gas. Next, InGa droplets are formed on the GaN layer by flowing trimethylgallium and trimethylindium source gases at temperatures ranging from about 570 C to about 880 C, and flow rates of about 2000 standard cubic centimeters per minute (sccm) for trimethylindium, and 100 sccm for trimethylgallium. After this step, ammonia is streamed over the droplets at a reactor temperature of 670 C or above. This results in InGaN nano-rings with high indium concentrations of about 68 percent without any evident phase separation. For a reactor temperature of 770 C, the indium content of the InGaN nano-rings is about 44 percent without any evident phase separation.

Once formed, ring structures 110 may exhibit strain-relaxation over conventional structures, as a result of their ring shape. Due to that strain-relaxed condition, the alloy making up ring structures 110 may incorporate higher levels of Indium. For example, in one embodiment, the alloy may include more than about 6 percent Indium. In another embodiment, the alloy may include more than about 40 percent Indium. In other embodiments, the Indium content of the alloy making up ring structures 110 may vary from about 40 percent to about 70 percent. In other embodiments, the Indium content of the alloy making up the ring structures 110 may be higher than 70 percent.

The percentage of Indium making up the alloy of ring structures 110 can be measured or determined using any suitable process. In one example, x-ray diffraction may be used to determine the percentage of Indium in ring structures 110. This may involve inspecting a plurality of ring structures 110 to determine an average percentage of Indium contained within the plurality of ring structures 110.

Once formed, ring structures 110 can be considered "nanostructures" or "nanorings" as they have dimensions on the order of nanometers. For example, ring structures 110 may have a lateral size/diameter of about 60 nm to about 200 nm; a height of about 2 nm to about 20 nm; and a hole diameter of about 30 nm to about 150 nm, although the dimensions may be smaller or larger, as well.

Layer 112 of p-type GaN is deposited over and around ring structures 110 and may have a thickness of about 10 nm to about 1000 nm, although layer 112 may be thinner or thicker, as well. Generally, layer 112 is thick enough to cover the nanorings and may extend above the nanorings. Layer 112 is, in some locations, formed in contact with layer 108 of n-GaN material. Layer 112 may be deposited using thin film deposition techniques such as Chemical Vapor Deposition (CVD), Physical Vapor Deposition (PVD), electrolytic plating, and electroless plating processes. In a PVD process, layer 112 is deposited onto the surface of the layer 108 using a low temperature (e.g., room temperature) radio frequency (RF) sputtering technique. In alternate embodiments, layer 112 may be formed using other sputtering techniques (e.g., direct current (DC) sputtering, ion-beam sputtering, ion-assisted sputtering, reactive sputtering, gas flow sputtering, high target utilization sputtering, or high power impulse magnetron sputtering). In still other embodiments, other deposition techniques may be used to deposit layer 112, including molecular beam deposition, spray pyrolysis, pulse laser deposition, or other suitable methods.

Positive electrode 114 is formed over layer 112 and includes a conductive material such as Nickel/Gold (Ni/Au). In other embodiments, electrode 114 may include other metals and/or combinations of metals, such as Aluminum (Al), Copper (Cu), Tin (Sn), or Silver (Ag) and/or other conductive materials such as graphene, conducting polymer materials, conducting organic materials, carbon nanotube sheets (with or without doping), and other suitable conductive materials. Electrode 114 may have a thickness ranging from about 10 nm to about 1000 nm, although electrode 114 may be thinner or thicker, as well. In an embodiment, electrode 114 is thin enough to be optically transparent, although electrode 114 may be thicker as well, and thus may be more opaque. In one embodiment, electrode 114 is fabricated with a thickness making electrode 114 transparent to electromagnetic radiation having wavelengths from about 390 nm to about 700 nm.

Electrode 114 and layer 112 may be shaped by any suitable fabrication processes including deposition and patterning. In such a process, both layer 112 and electrode 114 may be formed across the entire surface of n-type GaN layer 108 (or at least a large portion of layer 108). A light-sensitive material, such as photoresist, could then be deposited over the material layer for electrode 114. A pattern is transferred from a photomask to the photoresist using light. The portion of the photoresist pattern subjected to light is removed using a solvent, exposing portions of the material layer for electrode 114. The exposed portions of the material layer for electrode 114 and underlying portions of layer 112 are then removed. The remainder of the photoresist can then be removed, leaving behind layer 112 and electrode 114 patterned in the manner illustrated in FIGS. 1A and 1B.

In various embodiments, all or a portion of electrode 114 may be rendered transparent by maintaining the thickness of electrode 114 less than about 10 nm in the optically transparent regions. In one embodiment, portions of electrode 114 may be considered transparent when those portions have transmittance of greater than 70 percent in an electromagnetic energy band of interest. Taken together, ring structures 110, layer 112 and electrode 114 form device stack 118.

Device stack 118 depicted in FIGS. 1A and 1B includes four ring structures 110 (see FIG. 1B). It will be understood, however, that in various other embodiments, device stack 118 may include any number of ring structures 110. In one particular embodiment, for example, where the surface area of electrode 114 ranges from about 10 microns (um) square up to 100 um square, as many as about 10,000 or more ring structures 110 (e.g., for a 10 um square electrode) and about 1,000,000 or more ring structures 110 (e.g., for a 100 um square electrode) may be formed.

Negative electrode 116 is formed over n-type GaN layer 108 and may include a conductive material such as Titanium/Aluminum (Ti/Al) (or another suitable material). Negative electrode 116 may be formed by any suitable fabrication process including deposition and patterning. In such a process, negative electrode 116 may be formed across the entire surface of n-type GaN layer 108 (or at least a large portion of layer 108). A light-sensitive material, such as photoresist, could then be deposited over negative electrode 116 and used to pattern negative electrode 116 in the manner illustrated in FIGS. 1A and 1B.

Taken together, electrodes 114 and 116 form the two electrodes of device 100. When an electric potential is applied across electrodes 114 and 116, that electric potential is at least partially supplied or applied to ring structures 110, potentially causing ring structures 110 to emit electromagnetic radiation. Ring structures 110 may emit electromagnetic radiation horizontally (as indicated by arrows 115), or, if electrode 114 is transparent, vertically through electrode 114 (as indicated by arrows 117). The wavelength of electromagnetic radiation emitted by ring structures 110 will be at least partially determined by the chemical makeup of ring structures 110 and, specifically, the ratio of InN to GaN in the alloy of ring structures 110. Conversely, if ring structures 110 are configured to detect electromagnetic radiation of a particular wavelength, upon electromagnetic radiation of that wavelength striking one of ring structures 110, an electric current or potential may be generated across electrodes 114 and 116. That electric current or potential can be sensed by other circuitry (not shown), thus enabling device 100 to operate as a photodetector for a particular wavelength of electromagnetic radiation. In such an implementation, the ratio of Indium to Gallium in the alloy of ring structures 110 at least partially determines the wavelengths of electromagnetic radiation to which the photodetector is sensitive.

Figure 1C:
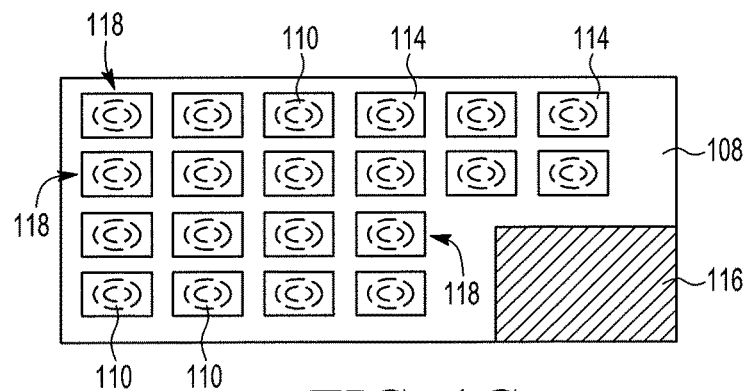
FIG. 1C is a top view of an embodiment of a device including a plurality of device stacks, each device stack including one or more nanoring structures.

FIGS. 1A and 1B illustrate cross-section and top views, respectively, of a layout of device 100 including a single device stack 118 including four ring structures 110 that are each housed under a single electrode 114. In alternative device layouts and configurations, however, multiple device stacks 118 including respective ring structures 110 and corresponding electrodes 114 may be formed over substrate 102. Such an embodiment is illustrated in FIG. 1C, which depicts a top view of a device including a plurality of device stacks 118. Each device stack 118 shown in FIG. 1C may be constructed in a similar manner to device stack 118 of FIGS.

1A and 1B. The various device stacks 118 may each have the same number or differing numbers of ring structures 110. The device stacks 118 may all be of a similar geometrical configuration (as illustrated in FIG. 1C) or, alternatively, may vary in size and shape. Some device stacks 118 may include transparent electrodes 114, while other device stacks 118 may include non-transparent or only partially transparent electrodes 114. The electromagnetic sensitivity and operation of each device stack 118 may also differ. For example, some device stacks 118 may include ring structures configured to detect or emit electromagnetic radiation in a first range of frequencies, while other device stacks 118 may be configured to detect or emit electromagnetic radiation in other frequencies.

The device stacks 118 of FIG. 1C each share negative electrode 116, but each device stack 118 has a separate electrode 114. As such, each device stack 118 can be separately controlled by subjecting the electrode 114 of the device stack 118 to a particular electric potential or detecting a current or potential thereof.

Figure 2A:
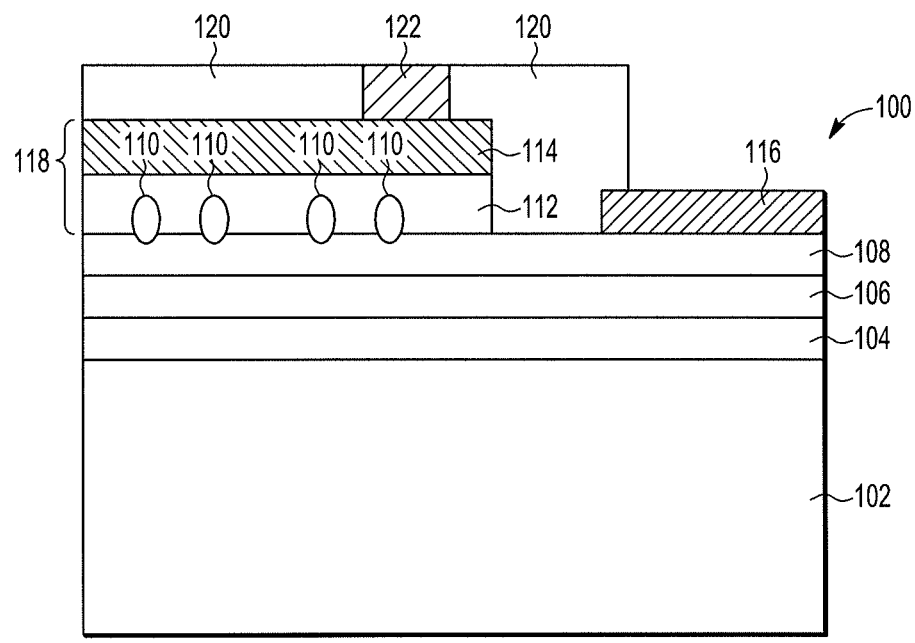
FIG. 2A is a cross-sectional side view of the device of FIG. 1A including an electrical interconnect structure formed over the device.
Figure 2B:
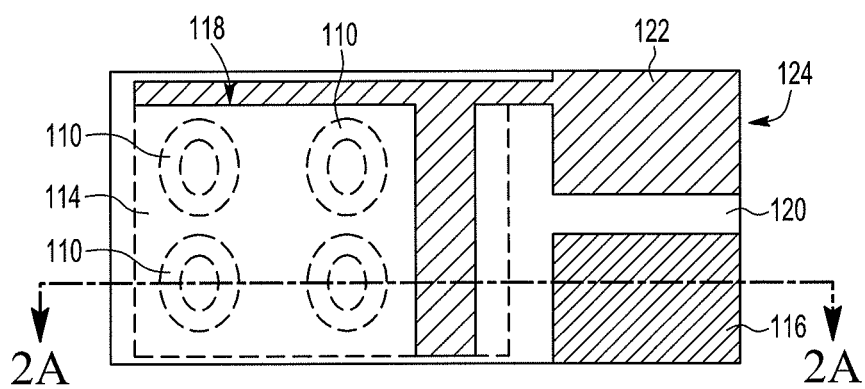
FIG. 2B is a top view of the device of FIG. 2A.
Figure 2C:
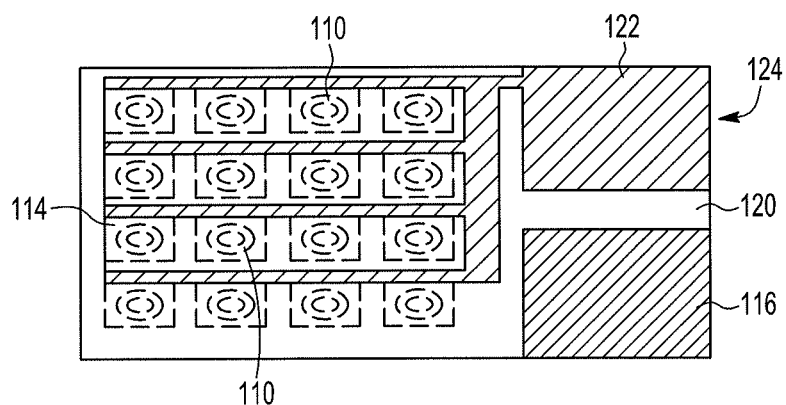
FIG. 2C is a top view of an alternate embodiment of a device including a plurality of electrically interconnected device stacks.

In some embodiments, as illustrated in FIGS. 2A-2C one or more device stacks 118 may be electrically interconnected to a separate electrode formed over substrate 102.

FIG. 2A shows a cross-sectional side view of device 100 (along line 2A-2A of FIG. 2B) including an electrical interconnect structure formed over device 100. FIG. 2B shows a top view of device 100 incorporating the electrical interconnect. In this embodiment, insulative layer 120 is formed over electrode 114, portions of n-type GaN layer 108 and portions of negative electrode 116. Layer 120 is generally insulative and can include materials such as silicon dioxide ($SiO_2$) or aluminum oxide ($Al_2O_3$). In other embodiments, insulative layer 120 may include barium oxide/tellurium oxide ($BaO-TeO_2$), indium tin oxide (InSnO), cerium oxide (CeO), nickel oxide (NiO), niobium oxide (NbO) (including niobium dioxide, and niobium pentoxide), tin oxide (SnO), tantalum oxide ($Ta_2O_5$), tungsten oxide (WO), zinc oxide (ZnO), chromium oxide (CrO), manganese oxide ($MnO_2$), titanium oxide ($TiO_2$), zirconium oxide (ZrO), boron bismuth oxide (BBiO), indium tin oxide (ITO), fluorine doped tin oxide (FTO), aluminum doped zinc oxide (AZO), indium-doped cadmium-oxide, or other doped metal oxides.

Once deposited, insulative layer 120 can be polished flat, for example, using chemical-mechanical polishing (CMP), wet etching, or plasma etching processes. Layer 120 can then be etched, such as via photoresist patterning, to expose a portion of electrode 114. With insulative layer 120 etched, conductive layer 122 is then deposited and patterned over insulative layer 120 to be in electric contact with electrode 114 and to form electrode 124 over substrate 102. Although conductive layer 122 may include any suitable conductive material, in one embodiment conductive layer 122 includes Titanium/Gold (Ti/Au).

In the illustrated embodiment, because insulative layer 120 covers electrode 114 and ring structures 110, the material making up insulative layer 120 may be generally transmissive to electromagnetic radiation so that electromagnetic radiation generated by ring structures 110 may be emitted through insulative layer 120. As such, the material of insulative layer 120 can be selected for its particular light-emitting properties such as transmissivity and refractive index. The desired electromagnetic radiation transmission properties of insulative layer 120 may therefore be at least partially determined by the spectrum of electromagnetic radiation emitted by ring structures 110. For example, insulative layer 120 may exhibit about 70 percent to about 98 percent transparency to the target electromagnetic radiation.

FIGS. 2A and 2B show an embodiment of device 100 including a single device stack 118. In alternative layouts, however, multiple device stacks 118 including respective ring structures 110 and corresponding electrodes 114 may be formed over substrate 102. Such an embodiment is illustrated in FIG. 2C, which depicts a top view of a device including a plurality of device stacks 118 and ring structures 110. In the illustrated embodiment, the electrodes 114 of each device stack 118 have been interconnected by conductive layer 122. When an electrical potential is applied to electrode 124, therefore, that electric potential is applied to each device stack 118 through conductive layer 122. In other embodiments, device stacks 118 may be electrically connected using any suitable method, including wire bonds (either coupled directly to electrodes 114 or to solder bumps that are first deposited on electrodes 114).

Figure 3:
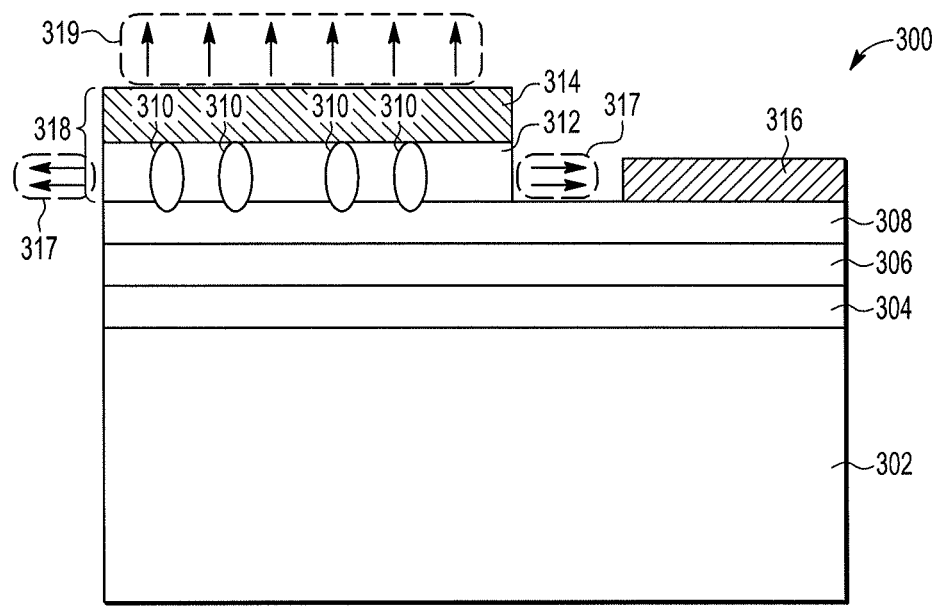
FIG. 3 is a cross-section side view of another alternate embodiment of a device incorporating a number of nanoring structures.

FIG. 3 shows a cross-section side view of an alternate embodiment of a device 300 incorporating a number of high Indium-content non-phase-separated InGaN nanoring structures. Device 300 includes a substrate 302, which has a configuration that depends on the type of system into which device 300 is incorporated. Substrate 302 may include an aluminum-based material such as $Al_2O_3$. Alternatively, substrate 302 may be selected from any of a variety of materials and their combinations, including semiconductor materials (e.g., Silicon, GaN, GaAs, and so on), glass, plastic (e.g., polyethylene naphthalate), and so on.

Substrate 302 is nitridized to form a layer 304 of AlN. A layer 306 of GaN is deposited over the nitridized layer 304 over substrate 302. In one embodiment, layer 306 has a thickness ranging from about 10 nm to about 1000 nm, although layer 306 may be thinner or thicker, as well. Finally, a layer 308 of n-type GaN is deposited over layer 306. In one embodiment, layer 308 has a thickness ranging from about 10 nm to about 1000 nm, although layer 308 may be thinner or thicker, as well. Each of layers 304, 306, and 308 may be formed by any suitable fabrication process.

Ring structures 310 are then formed over layer 308. Ring structures 310 may be formed out of an InGaN alloy in which the amount of Indium present is selected so that the alloy operates at a desired wavelength of electromagnetic radiation. Generally, the radiation output or sensitivity of ring structures 310 can vary from about 0.7 eV to about 3.4 eV or from wavelengths of about 0.36 um to about 1.77 um, although the radiation output and/or wavelengths can be smaller or greater, as well. Those of skill in the art would understand, based on the description herein, that the various embodiments may be implemented in devices configured to absorb or produce electromagnetic radiation in any of these ranges, or in other ranges as well.

Ring structures 310 may be formed using any suitable fabrication process. In one embodiment, ring structures 310 are formed by InGaN droplet-epitaxy, though other techniques may be used. In one embodiment, ring structures 310 may be formed as self-assembling InGaN rings based upon an appropriate choice of MOCVD growth conditions.

Once formed, ring structures 310 may exhibit strain-relaxation over conventional structures, as a result of their ring shape. Due to that strain-relaxed condition, the alloy making up ring structures 310 may incorporate higher levels of Indium. For example, in one embodiment, the alloy may include more than about 6 percent Indium. In another embodiment, the alloy may include more than about 40 percent Indium. In other embodiments, the Indium content of the alloy making up ring structures 310 may vary from about 40 percent to about 70 percent. In other embodiments, the Indium content of the alloy making up ring structures 310 may be higher than 70 percent.

Once formed, ring structures 310 can be considered "nanostructures" or "nanorings". For example, ring structures 310 may have a lateral size/diameter of about 60 nm to about 200 nm; a height of about 2 nm to about 20 nm; and a hole diameter of about 30 nm to about 150 nm, although these dimensions may be smaller or larger, as well. Ring structures 310, once formed, may be at least partially coated in a p-type GaN material using suitable deposition processes. As such, the p-type GaN material may form a coating over at least a portion of ring structures 310.

Figure 4A:
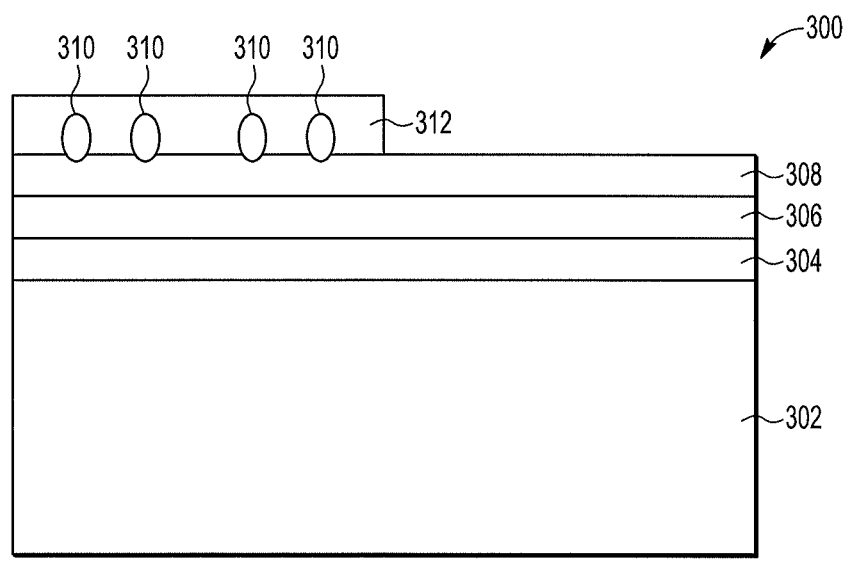
FIGS. 4A and 4B depicts steps in the formation of a spin-on-glass layer over the device of FIG. 3, according to an embodiment.
Figure 4B:
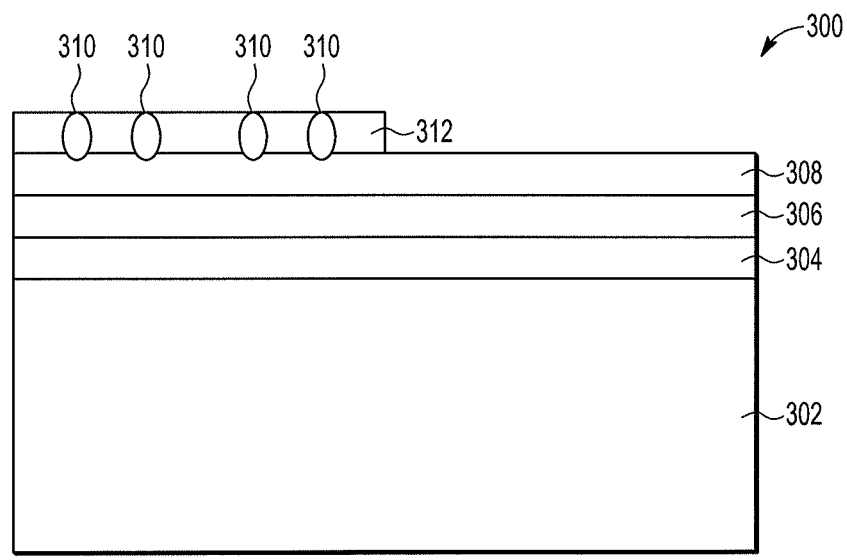

Layer 312 of spin-on-glass (SOG) is deposited over and around ring structures 310. Layer 312 may have a thickness of about 10 nm to about 1000 nm, although layer 312 may be thinner or thicker, as well. Generally, layer 312 is thick enough to cover ring structures 310 and may extend above ring structures 310. Layer 312 is, in some locations, formed in contact with layer 308 of n-GaN. In one embodiment, layer 312 is first deposited over ring structure 310. After being deposited, layer 312 can be planarized to reduce the height of layer 312 and expose at least a portion of ring structures 310. Such an approach is illustrated in FIGS. 4A and 4B. FIG. 4A shows device 300 following the initial formation of SOG layer 312 over ring structures 310. As illustrated, layer 312 is formed over and appears to cover or encapsulate ring structures 310. FIG. 4B depicts device 300 following the planarization of layer 312. Layer 312 may be planarized using any suitable process, such as CMP, wet etching, or plasma etching processes. A sufficient amount of layer 312 is removed so that, as illustrated in FIG. 4B, top portions of ring structures 310 are exposed. Following planarization, about 0 percent to about 30 percent of the height of ring structures 310 may be removed, depending on the planarization technique. As such, ring structures 310 may be in contact with a next layer (e.g., layer 314) formed over ring structures 310 and SOG layer 312.

In other embodiments, layer 312 may instead be initially formed so as to not entirely cover ring structures 310, thereby leaving at least a portion of ring structures 310 uncovered by layer 312.

Returning to FIG. 3, positive electrode 314 is formed over layer 312 in contact with ring structures 310 and includes a conductive material such as Ni/Au. In other embodiments, electrode 314 may include other metals and/or combinations of metals, such as Al, Cu, Sn, or Ag and/or other conductive materials such as graphene, conducting polymer materials, conducting organic materials, carbon nanotube sheets (with or without doping), and other suitable conductive materials. In one embodiment, electrode 314 may have a thickness ranging from about 10 nm to about 1000 nm, although electrode 314 may be thinner or thicker, as well. When electrode 314 is sufficiently thin, it may be optically transparent, and when electrode 314 is thicker, it may be more opaque. In one embodiment, electrode 314 is fabricated with a thickness making electrode 314 transparent to electromagnetic radiation having wavelengths from about 390 nm to about 700 nm.

Electrode 314 and layer 312 may be formed by any suitable fabrication processes including deposition and patterning. In such a process, both layer 312 and the material layer for electrode 314 may be formed across the entire surface of n-type GaN layer 308 of substrate 302 (or at least a large portion of layer 308). A light-sensitive material, such as photoresist, could then be deposited over the material layer for electrode 314 and patterned. Exposed portions of the material layer for electrode 314 and underlying layer 312 can then be removed, leaving behind layer 312 and electrode 314 patterned in the manner illustrated in FIG. 3.

In various embodiments, all or a portion of electrode 314 may be transparent. In one embodiment, portions of electrode 314 may be considered transparent when those portions have transmittance of greater than about 70 percent in an electromagnetic energy band of interest. Taken together, ring structures 310, layer 312 and electrode 314 form device stack 318.

Figure 5:
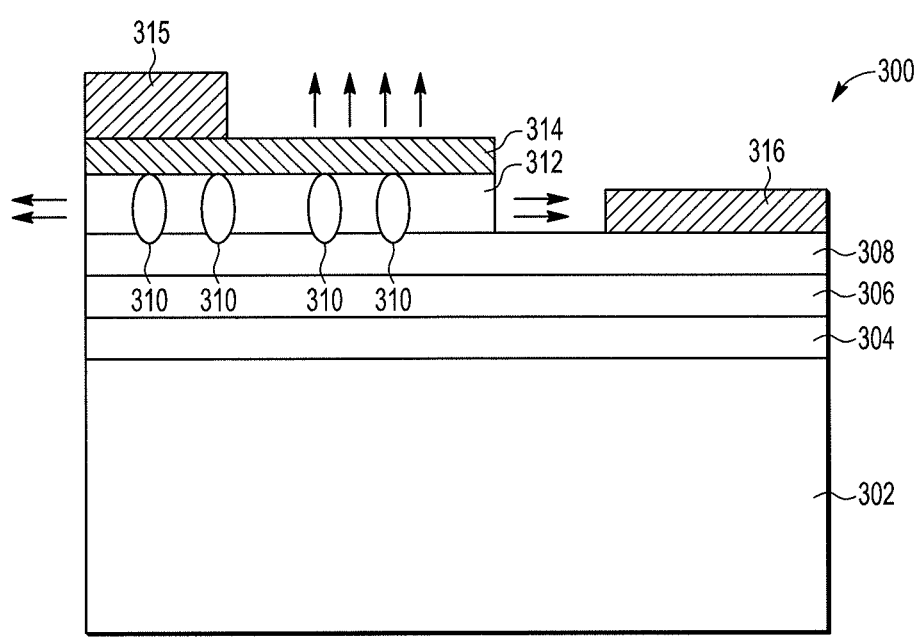
FIG. 5 depicts an alternate embodiment of the device shown in FIG. 3.

In some embodiments, a second conductive material 315 may be formed over electrode 314. Such an approach is illustrated in FIG. 5, in which electrode 314 is transparent. As such, electromagnetic radiation can pass through electrode 314. Conductive material 315 may be formed out of conductive materials such a Ni/Au or Ti/Al or Ti/Au. Because conductive material 315 does not entirely cover electrode 314, some electromagnetic radiation can pass through electrode 314, while conductive material 315 may be a more well-suited structure to which external device contacts can be made.

Device stack 318 may include any number of nanoring structures 310. In one particular embodiment, for example, where the surface area of electrode 314 about 10 um square up to 100 um square, as many as about 10,000 (for a 10 um square electrode) and about 1,000,000 (for a 100 square electrode) ring structures 310 may be formed within device stack 318.

Negative electrode 316 is formed over n-type GaN layer 308 and may include a conductive material such as Ti/Al (or another suitable material). Negative electrode 316 may be formed by any suitable fabrication process including deposition and patterning.

Taken together, electrodes 314 and 316 form the two electrodes of device 300 of FIG. 3. When an electric potential is applied across electrodes 314 and 316, that electric potential is applied to ring structures 310, potentially causing ring structures 310 to emit electromagnetic radiation. Ring structures 310 may emit electromagnetic radiation horizontally (as indicated by arrows 317), or, if electrode 314 is transparent or at least partially transparent, vertically through electrode 314 (as indicated by arrows 319). The wavelength of electromagnetic radiation emitted by ring structures 310 will be at least partially determined by the chemical makeup of ring structures 310 and, specifically, the ratio of Indium to Gallium in the alloy of ring structures 310. Conversely, if ring structures 310 are configured to detect electromagnetic radiation of a particular wavelength, upon electromagnetic radiation of that wavelength striking one of ring structures 310, an electric potential or current may be generated across electrodes 314 and 316. That electric potential or current could be sensed by other circuitry (not shown), thus enabling device 300 to operate as a photodetector for a particular wavelength of electromagnetic radiation. In such an implementation, the ratio of Indium to Gallium in the alloy of ring structures 310 at least partially determines the wavelengths of electromagnetic radiation to which the photodetector is sensitive.

FIG. 3 illustrates a cross-section view of a layout of device 300 including a single device stack 318 including ring structures 310 that are each housed under electrode 314. In alternative device layouts and configurations, however, multiple device stacks 318 including respective ring structures 310 and corresponding electrodes 314 may be formed over substrate 302. In such an embodiment, each device stack 318 could be constructed in a similar manner but may exhibit different operation or functionality. The various device stacks 318 may each have the same number or differing numbers of ring structures 310. The device stacks 318 may all be of a similar geometrical configuration or, alternatively, may vary in size and shape. Some device stacks 318 may include transparent electrodes 314, while other device stacks 318 may include non-transparent or only partially transparent electrodes 314.

When multiple device stacks 318 are formed over substrate 302, each device stack 318 may share negative electrode 316, but each device stack 318 may have a separate electrode 314. As such, each device stack 318 can be separately controlled by subjecting the electrode 314 of the device stack 318 to a particular electric potential.

Figure 6A:
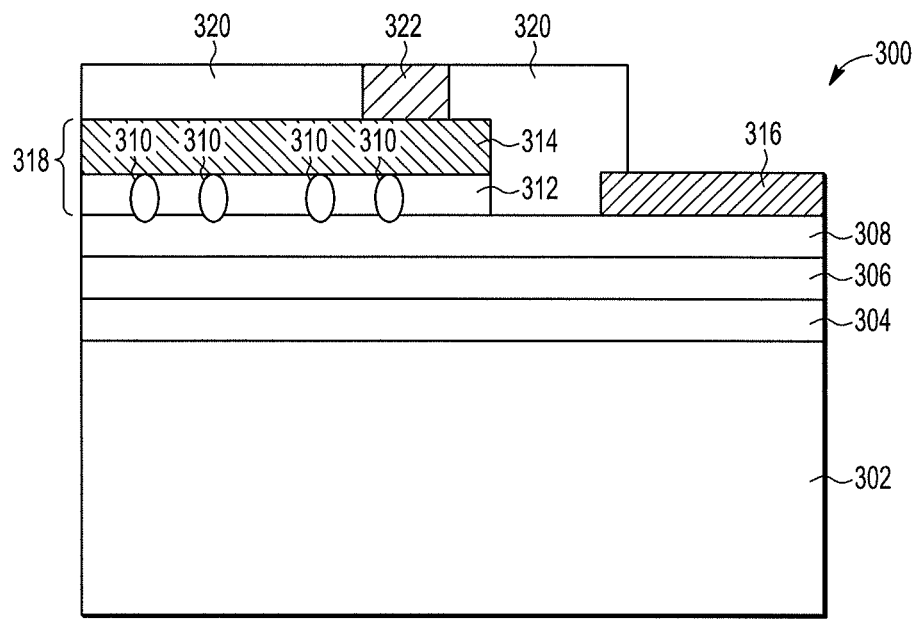
FIG. 6A depicts a cross-sectional side view of the device of FIG. 3 including an electrical interconnect structure formed over the device.
Figure 6B:
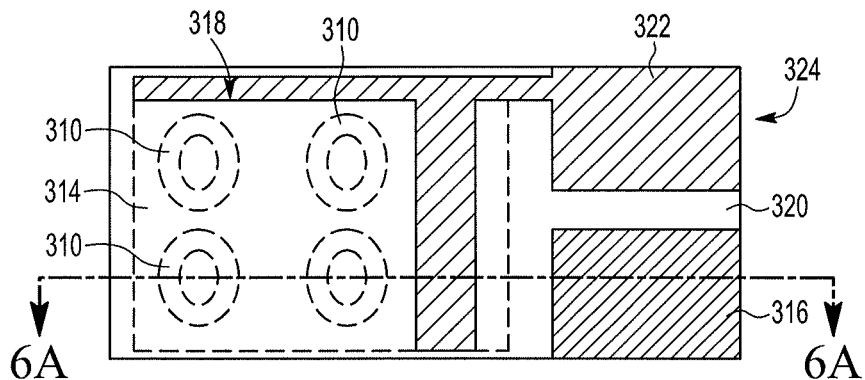
FIG. 6B is a top view of the device of FIG. 6A.
Figure 6C:
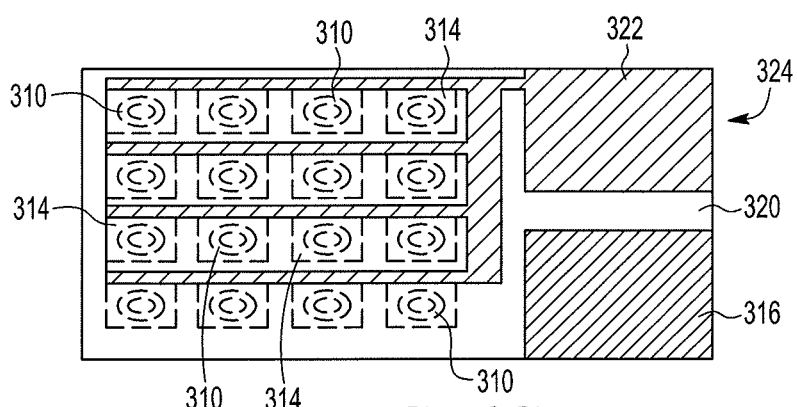
FIG. 6C is a top view of an alternate embodiment of a device including a plurality of electrically interconnected device stacks.

In some embodiments, as illustrated in FIGS. 6A-6C one or more device stacks 318 formed over substrate 302 may be electrically interconnected to a separate electrode formed over substrate 302.

FIG. 6A shows a cross-sectional side view of device 300 (along line 6A-6A of FIG. 6B) including an electrical interconnect structure formed over device 300. FIG. 6B shows a top view of device 300 incorporating the electrical interconnect. In this embodiment, insulative layer 320 is formed over electrode 314, portions of n-type GaN layer 308 and portions of negative electrode 316. Layer 320 is generally insulative and can include materials such as $SiO_2$ or $Al_2O_3$. In other embodiments, insulative layer 320 may include BaO—$TeO_2$, InSnO, CeO, NiO, NbO (including niobium dioxide, and niobium pentoxide), SnO, $Ta_2O_5$, WO, ZnO, CrO, $MnO_2$, $TiO_2$, ZrO, BBiO, ITO, FTO, AZO, indium-doped cadmium-oxide, or other doped metal oxides. Note that in FIGS. 6B and 6C, portions of insulative layer 320 that would otherwise cover or obscure electrodes 314 are not depicted in the figures so as to not obscure electrodes 314.

Once deposited, insulative layer 320 can be polished flat, for example, using CMP, wet etching, or plasma etching processes. Layer 320 can then be etched, such as via photoresist patterning, to expose a portion of electrode 314. With insulative layer 320 etched, conductive layer 322 is then deposited and patterned over insulative layer 320 to be in electric contact with electrode 314 and to form electrode 324 over substrate 302. Although conductive layer 322 may include any suitable conductive material, in one embodiment conductive layer 322 includes Ti/Au.

In the illustrated embodiment, because insulative layer 320 covers electrode 314 and ring structures 310, the material making up insulative layer 320 is generally transmissive to electromagnetic radiation so that electromagnetic radiation generated by ring structures 310 may be emitted through insulative layer 320. As such, the material of insulative layer 320 can be selected for its particular light-emitting properties such as transmissivity and refractive index. The desired electromagnetic radiation transmission properties of insulative layer 320 may therefore be at least partially determined by the spectrum of electromagnetic radiation emitted by ring structures 310. For example, insulative layer 320 may exhibit about 70 percent to about 98 percent transparency to the target electromagnetic radiation.

FIGS. 6A and 6B show an embodiment of device 300 including a single device stack 318. In alternative layouts, however, multiple different device stacks 318 including respective ring structures 310 and corresponding electrodes 314 may be formed over substrate 302. This embodiment is illustrated in FIG. 6C, which depicts a top view of a device including a plurality of device stacks 318 and ring structures 310. In this embodiment, the electrodes 314 of each device stack 318 have been interconnected by conductive layer 322. When an electrical potential is applied to electrode 324, therefore, that electric potential is applied to each device stack 318 through conductive layer 322. In other embodiments, device stacks 318 may be electrically connected using any suitable method, including wire bonds (either coupled directly to electrodes 314 or to solder bumps that are first deposited on electrodes 314).

Figure 7:
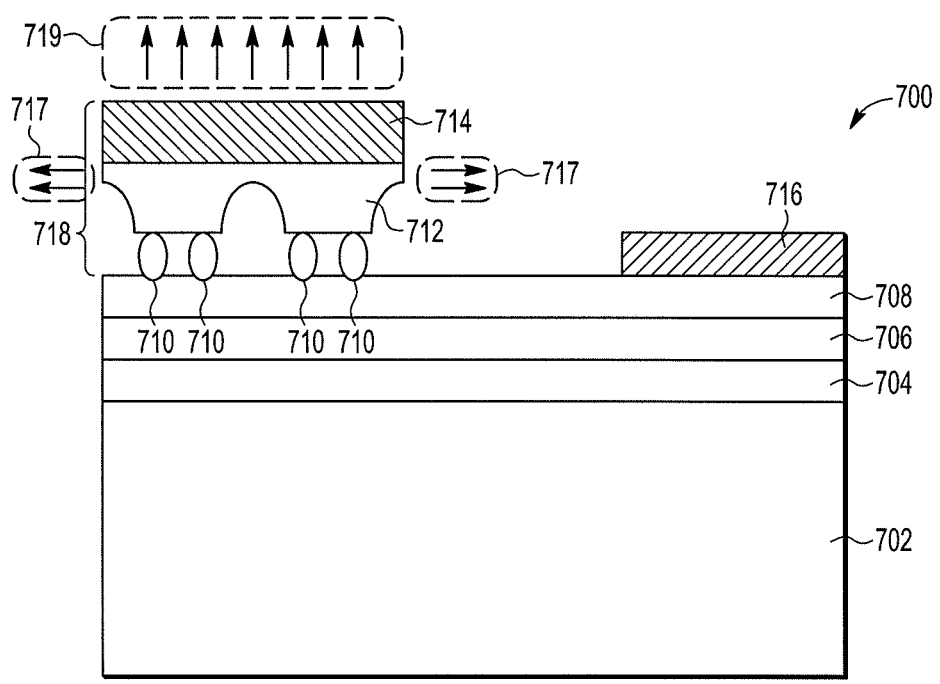
FIG. 7 shows a cross-section side view of an alternate embodiment of a device incorporating a number of nanoring structures including a layer grown by selective lateral overgrowth.

FIG. 7 shows a cross-section side view of an alternate embodiment of device 700 incorporating a number of high-In InGaN nanoring structures. Device 700 includes a substrate 702, which has a configuration that depends on the type of system into which device 700 is incorporated. Substrate 702 may include an aluminum-based material such as $Al_2O_3$. Alternatively, substrate 702 may be selected from any of a variety of materials and their combinations, including semiconductor materials (e.g., Silicon, GaN, GaAs, and so on), glass, plastic (e.g., polyethylene naphthalate), and so on.

Substrate 702 is nitridized to form a layer 704 of AlN. A layer 706 of GaN is deposited over the nitridized layer 704 over substrate 702. In one embodiment, layer 706 has a thickness ranging from about 10 nm to about 1000 nm, although layer 706 may be thinner or thicker, as well. Finally, a layer 708 of n-type GaN is deposited over layer 706. Layer 708 may have a thickness ranging from about 10 nm to about 1000 nm, although layer 708 may be thinner or thicker, as well. Each of layers 704, 706, and 708 may be formed by any suitable fabrication process.

Ring structures 710 are then formed over layer 708. Ring structures 710 may be formed out of an InGaN alloy in which the amount of Indium present is selected so that the alloy operates at a desired wavelength of electromagnetic radiation. Generally, the radiation output or sensitivity of ring structures 710 can vary from about 0.7 eV to about 3.4 eV or from wavelengths of about 0.36 um to about 1.77 um, although the radiation output and/or wavelength may be smaller or greater, as well. Those of skill in the art would understand, based on the description herein, that the various embodiments may be implemented in devices configured to absorb or produce electromagnetic radiation in any of these ranges, or in other ranges as well.

Ring structures 710 may be formed using any suitable fabrication process. In one embodiment, ring structures 710 are formed by InGaN droplet-epitaxy, though other techniques may be used. In one embodiment, ring structures 710 may be formed as self-assembling InGaN rings based upon an appropriate choice of MOCVD growth conditions.

Once formed, ring structures 710 may exhibit strain-relaxation over conventional structures, as a result of their ring shape. Due to that strain-relaxed condition, the alloy making up ring structures 710 may incorporate higher levels of Indium. For example, in one embodiment, the alloy may include more than about 6 percent Indium. In another embodiment, the alloy may include more than about 40 percent Indium. In other embodiments, the Indium content of the alloy making up ring structures 710 may vary from about 40 percent to about 70 percent.

Once formed, ring structures 710 can be considered "nanostructures" or "nanorings". Ring structures 710 may have a lateral size/diameter of about 60 nm to about 200 nm; a height of about 2 nm to about 20 nm; and a hole diameter about 30 nm to about 150 nm, although these dimensions may be smaller or larger, as well.

Layer 712 of p-type GaN is then grown over ring structures 710. Layer 712 may be grown, for example, using a selective lateral over-growth of p-type GaN materials over ring structures 710. In an embodiment, layer 712 has a thickness ranging from about 10 nm to about 1000 nm, although layer 712 may be thinner or thicker, as well. According to an embodiment, layer 712 is thick enough to cover ring structures 710 and, in some cases, extend above ring structures 710. The growth of layer 712 in this manner (e.g., selective lateral over-growth) may reduce defect densities in the overlayer as compared to blanket epitaxy. In this configuration, the lateral overgrowth of layer 712 may reduce stress in the device stack 718 because the X-Y constraints can be reduced by the gaps formed between the ring structures 710 and overgrowth layer 712. In some embodiments, however, an SOG layer (not shown) could be formed to encapsulate portions of layer 712 to provide increased structural support.

Positive electrode 714 is formed over layer 712 and includes a conductive material such as Ni/Au. In other embodiments, electrode 714 may include other metals and/or combinations of metals, such as Al, Cu, Sn, or Ag and/or other conductive materials such as graphene, conducting polymer materials, conducting organic materials, carbon nanotube sheets (with or without doping), and other suitable conductive materials. In an embodiment, electrode 714 has a thickness ranging from about 10 nm to about 1000 nm, although electrode 714 may be thinner or thicker, as well. When electrode 714 is relatively thin, it may be optically transparent, while a thicker electrode 714 may be more opaque. In one embodiment, electrode 714 is fabricated with a thickness making electrode 714 transparent to electromagnetic radiation having wavelengths from about 390 nm to about 700 nm. Electrode 714 and layer 712 may be formed by any suitable fabrication process including deposition and patterning.

In various embodiments, all or a portion of electrode 714 may be transparent. In one embodiment, portions of electrode 714 may be considered transparent when those portions have transmittance of greater than about 70 percent in an electromagnetic energy band of interest. Taken together, ring structures 710, layer 712 and electrode 714 form device stack 718.

Device stack 718 may include any number of ring structures 710. In one particular embodiment, for example, where the surface area of electrode 714 ranges from about 10 um square up to about 100 um square, although electrode 714 may have a smaller or larger surface area. As many as about 10,000 (for a 10 um square electrode) and about 1,000,000 (for a 100 um square electrode) ring structures 710 may be formed within device stack 718.

Negative electrode 716 is formed over n-type GaN layer 708 and may include a conductive material such as Ti/Al (or another suitable material). Negative electrode 716 may be formed by any suitable fabrication process including deposition and patterning.

Taken together, electrodes 714 and 716 form the two electrodes of device 700 of FIG. 7. When an electric potential is applied across electrodes 714 and 716, that electric potential is applied to ring structures 710, potentially causing ring structures 710 to emit electromagnetic radiation. Ring structures 710 may emit electromagnetic radiation horizontally (as indicated by arrows 717), or, if electrode 714 is transparent or at least partially transparent, vertically through electrode 714 (as indicated by arrows 719). The wavelength of electromagnetic radiation emitted by ring structures 710 will be at least partially determined by the chemical makeup of ring structures 710 and, specifically, the ratio of Indium to Gallium in the alloy of ring structures 710. Conversely, if ring structures 710 are configured to detect electromagnetic radiation of a particular wavelength, upon electromagnetic radiation of that wavelength striking one of ring structures 710, an electric potential may be generated across electrodes 714 and 716. That electric potential may be sensed by additional circuitry (not shown), thus enabling device 700 to operate as a photodetector for a particular wavelength of electromagnetic radiation. In such an implementation, the ratio of Indium to Gallium in the alloy of ring structures 710 at least partially determines the wavelengths of electromagnetic radiation to which the photodetector is sensitive.

FIG. 7 illustrates a cross-section view of a layout of device 700 including a single device stack 718 including ring structures 710 that are each housed under electrode 714. In alternative device layouts and configurations, however, multiple device stacks 718 including respective ring structures 710 and corresponding electrodes 714 may be formed over substrate 702. In such an embodiment, each device stack 718 could be constructed in a similar manner. The various device stacks 718 may each have the same number or differing numbers of ring structures 710 where each of the ring structures 710 may be similarly or differently configured. The device stacks 718 may all be of a similar geometrical configuration or, alternatively, may vary in size and shape. Some device stacks 718 may include transparent electrodes 714, while other device stacks 718 may include non-transparent or only partially transparent electrodes 714.

When multiple device stacks 718 are formed over substrate 702, each device stack 718 may share negative electrode 716, but each device stack 718 may have a separate electrode 714. But, in some other embodiments, the electrodes 714 of each device stack 718 may be electrically interconnected to a separate electrode formed over substrate 702, in similar manner to the embodiments illustrated in FIGS. 2C and 6C.

For example, an insulative layer could be formed over each of the device stacks 718. The insulative layer could then be patterned or etched to expose portions of each electrode 714 of each device stack 718. A conductive layer could then be deposited and patterned over the insulative layer to be in electric contact with each electrode 714 of each device stack 718 and to form a separate electrode. In such a manner, each electrode 714 of each device stack 718 could be electrically connected with the separate electrode. In other embodiments, device stacks 718 may be electrically connected using any suitable method, including wire bonds (either coupled directly to electrodes 714 or to solder bumps that are first deposited on electrodes 714).

In such an arrangement, because the insulative layer would cover the electrodes 714 of each device stack 718, the material making up the insulative layer may be generally transmissive to electromagnetic radiation so that electromagnetic radiation generated by the ring structures 710 of each device stack 718 may be emitted through the insulative layer. As such, the material of the insulative layer can be selected for its particular light-emitting properties such as transmissivity and refractive index. The desired electromagnetic radiation transmission properties of the insulative layer may therefore be at least partially determined by the spectrum of electromagnetic radiation emitted by ring structures 710. For example, the insulative layer may exhibit about 70 percent to about 98 percent transparency to the target electromagnetic radiation.

Figure 8:
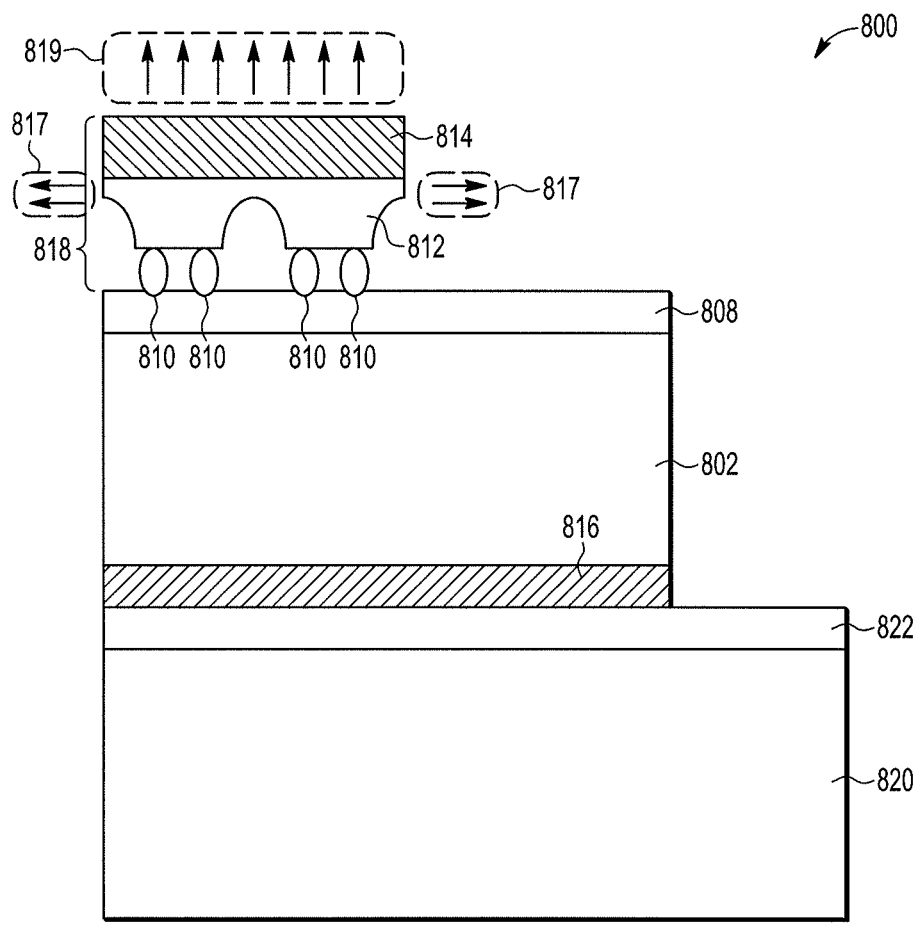
FIG. 8 shows a cross-section side view of an alternate embodiment of a device incorporating a number of nanoring structures and a silicon substrate.

FIG. 8 shows a cross-section side view of an alternate embodiment of device 800 incorporating a number of high-In InGaN nanoring structures formed over an Si-based substrate. Device 800 includes a substrate 802, which has a configuration that depends on the type of system into which device 800 is incorporated. Substrate 802 may include a {111}-oriented Si substrate, for example. A layer 808 of n-type GaN is deposited over substrate 802 using a suitable fabrication process. In one embodiment, layer 808 has a thickness of about 1-5 um, although layer 808 may be thinner or thicker, as well.

Ring structures 810 are then formed over layer 808. Ring structures 810 may be formed out of an InGaN alloy in which the amount of Indium present is selected so that the alloy operates at a desired wavelength of electromagnetic radiation. Generally, the radiation output or sensitivity of ring structures 810 can vary from about 0.7 eV to about 3.4 eV or from wavelengths of about 0.36 um to about 1.77 um, although the radiation output and/or wavelength may be smaller or greater, as well. Those of skill in the art would understand, based on the description herein, that the various embodiments may be implemented in devices configured to absorb or produce electromagnetic radiation in any of these ranges, or in other ranges as well.

Ring structures 810 may be formed using any suitable fabrication process. In one embodiment, ring structures 810 are formed by InGaN droplet-epitaxy, though other techniques may be used. In one embodiment, ring structures 810 may be formed as self-assembling InGaN rings based upon an appropriate choice of MOCVD growth conditions.

Once formed, ring structures 810 may exhibit strain-relaxation over conventional structures, as a result of their ring shape. Due to that strain-relaxed condition, the alloy making up ring structures 810 may incorporate higher levels of Indium. For example, in one embodiment, the alloy may include more than about 6 percent Indium. In another embodiment, the alloy may include more than about 40 percent Indium. In other embodiments, the Indium content of the alloy making up ring structures 810 may vary from about 40 percent to about 70 percent.

Once formed, ring structures 810 can be considered "nanostructures" or "nanorings". According to an embodiment, each ring structure 810 has a lateral size/diameter of about 60 nm to about 200 nm; a height of about 2 nm to about 20 nm; and a hole diameter of about 30 nm to about −150 nm, although these dimensions may be smaller or larger, as well.

Layer 812 of p-type GaN is then grown over ring structures 810. Layer 812 may be grown, for example, using a selective lateral over-growth of p-type GaN materials over ring structures 810. In an embodiment, layer 812 has a thickness ranging from about 10 nm to about 1000 nm, although layer 812 may be thinner or thicker, as well. According to an embodiment, layer 812 is thick enough to cover ring structures 810 and, in some cases, extend above ring structures 810. The growth of layer 812 in this manner (e.g., selective lateral over-growth) may reduce defect densities in the overlayer as compared to blanket epitaxy. In this configuration, the lateral overgrowth of layer 812 may reduce stress in the device stack 818 because the X-Y constraints can be reduced by the gaps formed between the ring structures 810 and overgrowth layer 812. In some embodiments, however, an SOG layer (not shown) could be formed to encapsulate portions of layer 812 to provide increased structural support.

Positive electrode 814 is formed over layer 812 and includes a conductive material such as Ni/Au. In other embodiments, electrode 814 may include other metals and/or combinations of metals, such as Al, Cu, Sn, or Ag and/or other conductive materials such as graphene, conducting polymer materials, conducting organic materials, carbon nanotube sheets (with or without doping), and other suitable conductive materials. In an embodiment, electrode 814 has a thickness of about 10 nm to about 1000 nm, although electrode 814 may be thinner or thicker, as well. A relatively thin electrode 814 may be optically transparent, and a thicker electrode 814 may be more opaque. In one embodiment, electrode 814 is fabricated with a thickness making electrode 814 transparent to electromagnetic radiation having wavelengths from about 390 nm to about 700 nm. Electrode 814 and layer 812 may be formed by any suitable fabrication process including deposition and patterning.

In various embodiments, all or a portion of electrode 814 may be transparent. In one embodiment, portions of electrode 814 may be considered transparent when those portions have transmittance of greater than about 70 percent in an electromagnetic energy band of interest. Taken together, ring structures 810, layer 812 and electrode 814 form device stack 818.

Device stack 818 may include any number of ring structures 810. In one particular embodiment, for example, where the surface area of electrode 814 ranges from about 10 um square up to about 100 um square, as many as about 10,000 (for a 10 um square electrode) and about 1,000,000 (for a 100 um square electrode) ring structures 810 may be formed within device stack 818.

Negative electrode 816 is formed over a back surface of substrate 802 and may include a conductive material such as Ti (or another suitable material). Negative electrode 816 may be formed by any suitable fabrication process including deposition and patterning.

Taken together, electrodes 814 and 816 form the two electrodes of device 800 of FIG. 8. When an electric potential is applied across electrodes 814 and 816, that electric potential is applied to ring structures 810, potentially causing ring structures 810 to emit electromagnetic radiation. Ring structures 810 may emit electromagnetic radiation horizontally (as indicated by arrows 817), or, if electrode 814 is transparent or at least partially transparent, vertically through electrode 814 (as indicated by arrows 819). The wavelength of electromagnetic radiation emitted by ring structures 810 will be at least partially determined by the chemical makeup of ring structures 810 and, specifically, the ratio of Indium to Gallium in the alloy of ring structures 810. Conversely, if ring structures 810 are configured to detect electromagnetic radiation of a particular wavelength, upon electromagnetic radiation of that wavelength striking one of ring structures 810, an electric potential or current may be generated across electrodes 814 and 816. That electric potential or current may be sensed by other circuitry (not shown), thus enabling device 800 to operate as a photodetector for a particular wavelength of electromagnetic radiation. In such an implementation, the ratio of Indium to Gallium in the alloy of ring structures 810 at least partially determines the wavelengths of electromagnetic radiation to which the photodetector is sensitive.

To provide for efficient heat removal from device 800, in some embodiments heat sink 820 is mounted to the backside of substrate 802. Heat sink 820 may include Cu or any other suitable thermally transmissive material. To facilitate attachment of heat sink 820, an InGa layer 822 may be formed over a surface of heat sink 820, though in other embodiments, the InGa layer 822 may instead be formed over a surface of electrode 816. A thermal anneal may then be utilized to cause local melting/interdiffusion of the InGa into the adjacent layers—Eutectic InGa, 75 percent Gallium and 25 percent In by weight, has a low melting point of ~15-16 degrees C. In other embodiments, layer 822 may be formed from another suitable material.

FIG. 8 illustrates a cross-section view of a layout of device 800 including a single device stack 818 having ring structures 810 that are each housed under electrode 814. In alternative device layouts and configurations, however, multiple device stacks 818 including respective ring structures 810 and corresponding electrodes 814 may be formed over substrate 802. In such an embodiment, each device stack 818 could be constructed in a similar manner. The various device stacks 818 may each have the same number or differing numbers of ring structures 810. The device stacks 818 may all be of a similar geometrical configuration or, alternatively, may vary in size and shape. Some device stacks 818 may include transparent electrodes 814, while other device stacks 818 may include non-transparent or only partially transparent electrodes 814. The various device stacks 818 may all share the same or similar functionality or may provide different functionality.

When multiple device stacks 818 are formed over substrate 802, each device stack 818 may share negative electrode 816, but each device stack 818 may have a separate electrode 814. But, in some other embodiments, the electrodes 814 of each device stack 818 may be electrically interconnected to a separate electrode formed over substrate 802, in similar manner to those illustrated in FIGS. 2C and 6C.

For example, an insulative layer could be formed over each of the device stacks 818 formed over substrate 802. The insulative layer could then be patterned or etched to expose portions of each electrode 814 of each device stack 818. A conductive layer could then be deposited and patterned over the insulative layer to be in electric contact with each electrode 814 of each device stack 818 and to form a separate electrode. In such a manner, each electrode 814 of each device stack 818 could be electrically connected with the separate electrode.

In such an arrangement, because the insulative layer would cover the electrodes 814 of each device stack 818, the material making up the insulative layer may be generally transmissive to electromagnetic radiation so that electromagnetic radiation generated by the ring structures 810 of each device stack 818 may be emitted through the insulative layer. As such, the material of the insulative layer can be selected for its particular light-emitting properties such as transmissivity and refractive index. The desired electromagnetic radiation transmission properties of the insulative layer may therefore be at least partially determined by the spectrum of electromagnetic radiation emitted by ring structures 810. For example, the insulative layer may exhibit about 70 percent to about 98 percent transparency to the target electromagnetic radiation.

Various embodiments of electronic devices and methods of their manufacture have been described.

An embodiment of a device includes a substrate, and an InGaN nanoring over the substrate. The InGaN nanoring includes an alloy of InN and GaN. The alloy includes at least 6 percent Indium. The device includes a first electrode over the InGaN nanoring.

An embodiment of a device includes a substrate, and a plurality of device stacks over the substrate. Each device stack in the plurality of device stacks includes a nanoring including an InGaN material. The InGaN material includes at least 6 percent Indium. Each device stack includes a first electrode over the nanoring.

An embodiment of a method includes forming a nanoring over a substrate. The nanoring includes materials exhibiting a lattice size mismatch with the substrate that exceeds 2 percent. The method includes forming a first contact over the nanoring, and forming a second contact on the substrate.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, the term "semiconductor" is intended to include any semiconductor whether single crystal, polycrystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as for example and not intended to be limiting, semiconductor-on-insulator (SOI) structures, and combinations thereof. For convenience of explanation and not intended to be limiting, semiconductor devices and methods of fabrication are described herein for GaN- or silicon-based semiconductors but persons of skill in the art will understand that other semiconductor materials may also be used. Additionally, various device types and/or doped semiconductor regions may be identified as being of N type or P type for convenience of description and not intended to be limiting, and such identification may be replaced by the more general description of being of a "first conductivity type" or a "second, opposite conductivity type" where the first type may be either N or P type and the second type then is either P or N type.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in each figure depict one exemplary arrangement of elements, additional intervening elements, devices, features, or components may be present in an embodiment of the depicted subject matter.

The foregoing detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the foregoing detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A device, comprising:
   a substrate;
   an n-type Gallium Nitride (GaN) layer formed over the substrate;
      a plurality of Indium Gallium Nitride (InGaN) nanorings formed over the n-type GaN layer, each InGaN nanoring of the plurality of InGaN nanorings including an alloy of Indium Nitride (InN) and Gallium Nitride (GaN), the alloy including at least 6 percent Indium, each InGaN nanoring of the plurality of InGaN nanorings having a maximum diameter of less than 100 nanometers and a height of less than 20 nanometers;
      a p-type GaN layer formed over and around the plurality InGaN nanorings, the p-type GaN layer having a thickness between 10 nanometers and 1000 nanometers, the p-type GaN layer being directly and physically connected between each InGaN nanoring of the plurality of InGaN nanorings and in direct contact with a portion of the n-type GaN layer not covered by the plurality of InGaN nanorings, wherein some portion of the p-type GaN layer is formed under a portion of each InGaN nanoring of the plurality of InGaN nanorings; and
      a first electrode formed over the plurality of InGaN nanorings.

2. The device of claim 1, wherein the first electrode is over the GaN layer.

3. The device of claim 1, including:
   a spin-on-glass layer over the substrate at least partially surrounding the plurality of InGaN nanorings.

4. The device of claim 3, wherein the first electrode is in contact with the spin-on-glass layer.

5. The device of claim 1, wherein the first electrode includes a nickel-gold material.

6. The device of claim 5, wherein the first electrode is at least partially transparent to electromagnetic radiation having a wavelength between 390 nanometers and 700 nanometers.

7. The device of claim 1, wherein the alloy includes more than 40 percent Indium.

8. A device, comprising:
   a substrate;
   a n-type GaN layer formed over the substrate; and
      a plurality of device stacks over the n-type GaN layer, each device stack in the plurality of device stacks including:
         a plurality of nanorings formed-over the n-type GaN layer, each nanoring of the plurality of nanorings including an Indium Gallium Nitride (InGaN) material, the InGaN material including at least 6 percent Indium and having a maximum diameter of less than 100 nanometers;
         a p-type GaN coating formed on and around each of the plurality of nanorings, the p-type GaN coating being directly and physically connected between each nanoring of the plurality of nanorings and in contact with the n-type GaN layer not covered by each of the plurality of nanorings, wherein some portion of the p-type GaN coating is formed under a portion of each nanoring of the plurality of nanorings; and
         a first electrode formed over the plurality of nanorings.

9. The device of claim 8, wherein the first electrode of each device stack is electrically interconnected by a conductive material.

10. The device of claim 8, further comprising a second electrode formed over the substrate, the second electrode not being electrically connected to the first electrode of each device stack.

11. The device of claim 8, wherein each device stack includes a spin-on-glass layer at least partially surrounding the nanoring of each device stack.

12. The device of claim 8, wherein the first electrode of each device stack is at least partially transparent to electromagnetic radiation having a wavelength between 390 and 700 nanometers.

13. The device of claim 8, wherein the material includes more than 40 percent Indium.

14. A method, comprising:
   forming a n-type semiconductor layer over a substrate;
   forming a plurality of nanorings over the n-type semiconductor layer, each nanoring of the plurality of nanorings including materials exhibiting a lattice size mismatch with the substrate that exceeds 2 percent;
   forming a p-type semiconductor layer over the plurality of nanorings wherein the p-type semiconductor layer is directly and physically connected and between each nanoring of the plurality of nanorings, wherein some portion of the p-type semiconductor layer is formed under a portion of each nanoring of the plurality of nanorings;
   forming a first electrode over the plurality of nanorings; and
   forming a second electrode on the substrate.

15. The method of claim 14, wherein forming the nanoring includes using droplet-epitaxy to deposit the materials exhibiting the lattice size mismatch with the substrate onto the substrate.

16. The method of claim 14, including forming a spin-on glass layer at least partially surrounding the nanoring.

17. The method of claim 14, wherein the nanoring includes an alloy of Indium Nitride (InN) and Gallium Nitride (GaN), the alloy including at least 6 percent Indium.

* * * * *